United States Patent
Nam

[19]

[11] Patent Number: 6,072,700
[45] Date of Patent: Jun. 6, 2000

[54] BALL GRID ARRAY PACKAGE

[75] Inventor: Teck Hown Nam, Seoul, Rep. of Korea

[73] Assignee: Hyundai Electronics Industries Co., Ltd., Kyoungki-do, Rep. of Korea

[21] Appl. No.: 09/107,759

[22] Filed: Jun. 30, 1998

[30] Foreign Application Priority Data

Jun. 30, 1997 [KR] Rep. of Korea ..................... 97-30380

[51] Int. Cl.[7] .......................... H05K 7/06; H01L 23/498
[52] U.S. Cl. .......................... 361/783; 361/761; 361/764; 361/803; 257/686; 257/723; 257/738; 257/777; 257/786
[58] Field of Search .................................. 174/52.1, 52.4, 174/260, 261; 228/180.21, 108.22; 257/737, 738, 723, 724, 780, 777, 778, 786, 686; 361/761–764, 735, 777, 790, 783, 803; 365/51; 438/109; 439/68, 69

[56] References Cited

U.S. PATENT DOCUMENTS

| 5,598,033 | 1/1997 | Behlen et al. ............................ | 257/686 |
| 5,798,564 | 8/1998 | Eng et al. ................................ | 257/686 |
| 5,814,883 | 9/1998 | Sawai et al. ............................ | 257/738 |

FOREIGN PATENT DOCUMENTS

| 7-297320  | 11/1995 | Japan . |
| 9-260533  | 10/1997 | Japan . |
| 10-116858 | 5/1998  | Japan . |
| 10-340932 | 12/1998 | Japan . |
| 11-26503  | 1/1999  | Japan . |
| 11-54655  | 2/1999  | Japan . |
| 11-67955  | 3/1999  | Japan . |

*Primary Examiner*—Leo P. Picard
*Assistant Examiner*—John B. Vigushin
*Attorney, Agent, or Firm*—Selitto & Associates

[57] ABSTRACT

A ball grid array package with an improved structure of aligning balls is disclosed. The BGA package comprises various elements such as a substrate and a semiconductor chip mounted in the substrate. The substrate has a first surface and a second surface which is positioned in a higher place than the first surface and is formed around the first surface. The semiconductor chip is arranged on the first surface, and has a plurality of pads for transferring signals, which is placed on the semiconductor chip. And At least one semiconductor chip is stacked so that the pads having an identical function on each layer are electrically connected to each other. The BGA package includes a plurality of leads which are mounted on the substrate and connected with a part of the pads of the semiconductor chip and exposed to the second surface. Furthermore, the BGA package of the present invention includes a plurality of conductive solder balls which are formed on the surface of the semiconductor chip and the second surface of the substrate, and electrically connected with the leads exposed to the second surface of the substrate and the pads of the semiconductor chip.

15 Claims, 4 Drawing Sheets

BALL GRID ARRAY PACKAGE

BACKGROUND OF THE INVENTION

1. Field of the Invention

The present invention relates to a ball grid array package, and more particularly, to a more particularly to a μ-ball grid array package with an improved structure of aligning balls.

2. Description of the Related Art

Recently, with the rapid development in a process of manufacturing an integrated circuit, a packaging technique which protects a number of unit devices formed on a unit chip from an outer environment has been progressed promptly. In most electronic units, it has been made an effort to reduce the surface area of a printed circuit board, as possible, on which a packaged semiconductor chip is mounted. In order to meet such effort, it is required that the size of a package should be smaller. As one of the techniques for miniaturizing the packaging size, Chip size package or chip scale package(CSP) which reduces the packaging size to a correspondent chip size has been proposed.

In addition, ball grid array (BGA) package, as a kind of such chip scale package, is noticed due to its excellence in performance and trust as well as the size. There are various kinds of such BGA package such as Plastic ball grid array (PBGA) package, Ceramic ball grid array (CBGA) package, Tape automated bonding ball grid array (TAB BGA) package and Ball grid array-like. Moreover, there is μ-ball grid array package developed in Tessera Inc.

In the above mentioned BGA packages, A signal is transferred through conductive balls from and to an external circuit. In the meantime, the more the integrity of a semiconductor chip is progressed, the more the number of the ball is increased. The increase in the number of the ball causes a short between the balls, and results in an error of data transferred through the balls. To solve the problem, it is required that the diameter of each ball should be reduced. However, it is very difficult to achieve this because of the limitation on the process.

Therefore, in all of the packages including the BGA package, it is necessary to increase the integrity without increasing the surface area which is occupied by the package.

SUMMARY OF THE INVEHTION

It is therefore an object of the present invention to provide a BGA package which can satisfy the requirement of increasing the number of solder balls for transferring signals to the outside according to the increase in the integrity.

It is an other object of the present invention to provide a BGA package which can progress the integrity without increasing the surface area.

According to one aspect of the present invention, the BGA package comprises various elements such as a substrate and a semiconductor chip mounted in the substrate. The substrate has a first surface and a second surface which is positioned in a higher place than the first surface and is formed around the first surface. The semiconductor chip is arranged on the first surface, and has a plurality of pads for transferring signals, which is placed on the semiconductor chip. And At least one semiconductor chip is stacked so that the pads having an identical function on each layer are electrically connected to each other. The BGA package includes a plurality of leads which are mounted on the substrate and connected with a part of the pads of the semiconductor chip and exposed to the second surface. Furthermore, the BGA package of the present invention includes a plurality of conductive solder balls which are formed on the surface of the semiconductor chip and the second surface of the substrate, and electrically connected with the leads exposed to the second surface of the substrate and the pads of the semiconductor chip.

According to the other aspect of the present invention, The BGA package comprises various elements such as a substrate and two semiconductor chip which is stacked in the substrate. The substrate has a first surface and a second surface which is positioned in a higher place than the first surface and is formed around the first surface. The semiconductor chip includes a first semiconductor chip which is arranged on the first surface and has a plurality of pads for transferring signals, which is placed on the upper edge of the semiconductor chip, and a second semiconductor chip which is arranged on the upper face of the first semiconductor chip. The second semiconductor chip has a smaller size than the first semiconductor chip so as to expose the pads of the first semiconductor chip. In addition, the BGA package of the present invention includes a plurality of leads which are mounted on the substrate and electrically connected with the pads of the first semiconductor chip and exposed to the second surface. Furthermore, the BGA package of the present invention includes a plurality of conductive solder balls which are formed on the surface of the second semiconductor chip and the second surface of the substrate, and electrically connected with the leads exposed to the second surface of the substrate and the pads of the second semiconductor chip.

DETAILED DESCRIPTION OF THE INVENTION

I. Conventional BGA Package

Figure 1:
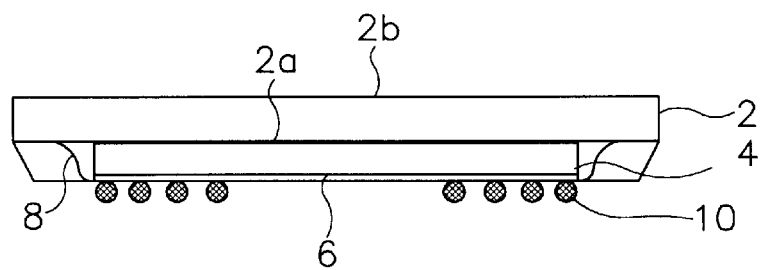
FIG. 1 shows a schematic cross-sectional view of ball grid array package according to a conventional art.

FIG. 1 is a schematic cross-sectional view of a μ-BGA package of a group of conventional chip scale packages.

Referring to FIG. 1, a semiconductor chip 2 or die is provided with an inner surface and an outer surface 2b. A plurality of semiconductor devices are formed in the inner surface 2a. On the inner surface 2a, there are also formed bonding pads, (not shown), in which signals are transferred from and to an external circuit. The bonding pads are formed at the edges of the inner surface 2a of the semiconductor chip. In FIG. 1, the inner surface 2a of the semiconductor chip is directed toward the lower side. A buffered layer 4 and a beam lead film (or patterned layer) 6 which circuit wires are printed on are stacked in order on the inner surface 2a of the semiconductor chip. Hereinafter, the buffered layer 4 and beam lead film 6 are referred to a compliant layer. The wires of the beam lead film 6 are electrically connected through bonded wires 8 with the bonding pads of the semiconductor chip. On the surface of the beam lead film 6, there is provided a plurality of conductive solder balls 10. The conductive balls 10 are soldered to the wires formed on a printed circuit board of the external unit, or connected to a socket, whereby the above BGA package forms a system for transferring electric signals.

In the above BGA package, the reduction in diameter of the ball and highly advanced method of bonding the beam lead are required to increase the number of balls according as the integrity and miniaturization of the semiconductor chip are gradually progressed. If such requirements are not satisfied, the reduction in the size of the semiconductor chip would be restricted.

II. Present BGA Package

Hereinafter, preferred embodiments of the present invention will be explained in more detail with reference to the accompanying drawings.

Figure 2:
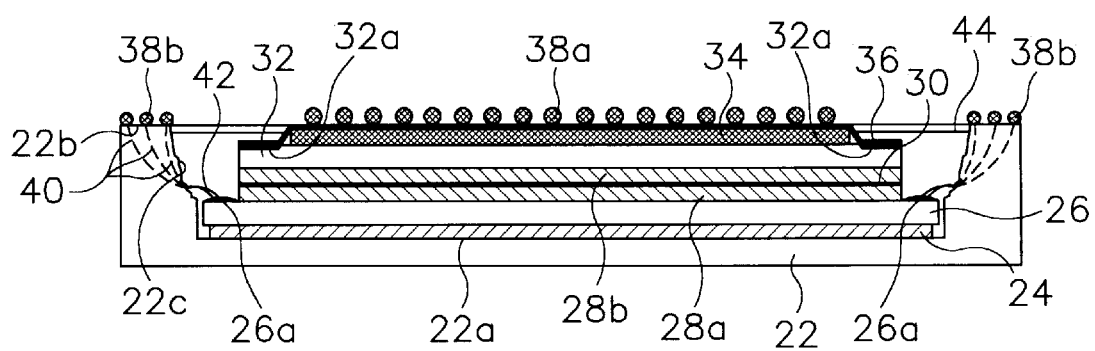
FIG. 2 shows a schematic cross-sectional view of ball grid array package according to an embodiment of the present invention.

Referring to FIG. 2, a BGA package of the present invention comprises a substrate 22 having a first surface 22a and a second surface 22b. The substrate 22 further comprises an inner wall surface 22c which connects ends of the first and second surfaces 22a, 22b. The first surface 22a of the substrate 22 has a bigger size than that of the chip in order for semiconductor chips 26, 32 to be mounted thereon. The first surface 22a of the substrate 22 is formed at the center of inner face of the substrate 22, and the second surface 22b is positioned along the edge of the first surface 22a in a place which is higher by a distance than the first surface 22a. The first surface 22a has a width which is slightly bigger than those of the semiconductor chips 26, 32.

The semiconductor chips 26, 32 comprises a first semiconductor chip 26 of which the external surface is attached to the first surface 22a with a first adhesive layer 24 being interposed therebetween, and a second semiconductor chip 32 of which the external surface is attached to the first semiconductor chip 26 with a first tape 28a and second tape 28b being interposed therebetween. Between the first and second tape 28a, 28b, there is interposed a carrier film 30. In addition, bonding pads 26a, 32a (see FIG. 2) are formed at the edge portions of the first and second semiconductors 26, 32, respectively. The edge portions, in which the bonding pads 26a of the first semiconductor chip 26 are placed, is formed to be bigger by a width than that of the second semiconductor chip 32, so that the bonding pads 26a of the first semiconductor chip 26 is not cover by the second semiconductor chip 32 located on the first semiconductor chip 26 but exposed to the outside. On the second semiconductor chip 32, there is placed a buffered layer 34 which has a size capable of exposing the bonding pads 26a on the edge of the second semiconductor chip 32. As a merely example of the buffered layer, an elastomer is used. On the upper portion of the elastomer 34 and the edge of the second semiconductor chip 32, a flexible conductive beam lead film 36 is covered. The beam lead film 36 includes a plurality of first leads, and the first leads is extended from the edge portion, in which the bonding pads 32a of the second semiconductor chip 32 are placed, to the upper face of the elastomer 34. Furthermore, one ends of the first leads of the beam lead film 36 are contacted with the bonding pads 32a of the second semiconductor chip 32 and the other ends are contacted with first conductive solder balls which are attached to the beam lead film 36.

In the substrate 22, there are buried second leads 40 of which both ends are exposed to the inner surface 22b and inner wall surface 22c. The one ends of the second leads 40 exposed to the inner surface 22c of the substrate 22 are bonded though wires 42 to the correspondent bonding pads 26a of 30 the first semiconductor chip 26. The other ends of the second leads 40 exposed to the second surface 22b of the substrate 22 are contacted with second solder balls 38b formed on the second surface 22b. In order to adhere and protect the wires 42 and the printed circuit board placed on the edge of the second semiconductor chip 32 against an impact from the outside, a sealant 44 is covered thereon.

The first and second conductive solder balls 38a, 38b are soldered to the wires formed in the printed circuit board, or connected to the socket, whereby the BGA package forms a system for transferring electric signals.

In the meantime, according to a design rule, all of the bonding pads 26a of the first semiconductor chip 26 may be electrically connected with the second solder ball 38b. Alternatively, only a part of the bonding pads 26a of the first semiconductor chip 26 may be electrically connected with the second solder ball 38b. In case that a part of the bonding pads 26a may be electrically connected with the second solder ball 38b, the rest of the bonding pads 26a are connected with the remaining leads of the first leads of the beam lead film 36, which are not connected with the bonding pads 32a of the second semiconductor chip 32, thereby being connected with the first solder balls 38a.

As mentioned above, the structure of connecting the bonding pads can be changed. As a result, the bonding structure according to the embodiment can be equally applied to Read Only Memory (ROM) or Random Access Memory (RAM) in which functions of the first and second semiconductor chip 26, 32 are same. Moreover, if the functions of the first and second semiconductor chip 26, 32 are different "from" each other, for example, if the first semiconductor chip 26 is a microprocess as a control chip and the second semiconductor chip 32 is a RAM or ROM as a memory chip, the structure of the embodiment can be applied.

Hereinafter, a method of manufacturing the BGA package of FIG. 2 will be explained in more detail with reference to FIGS. 3A to 5B.

Figure 3A:
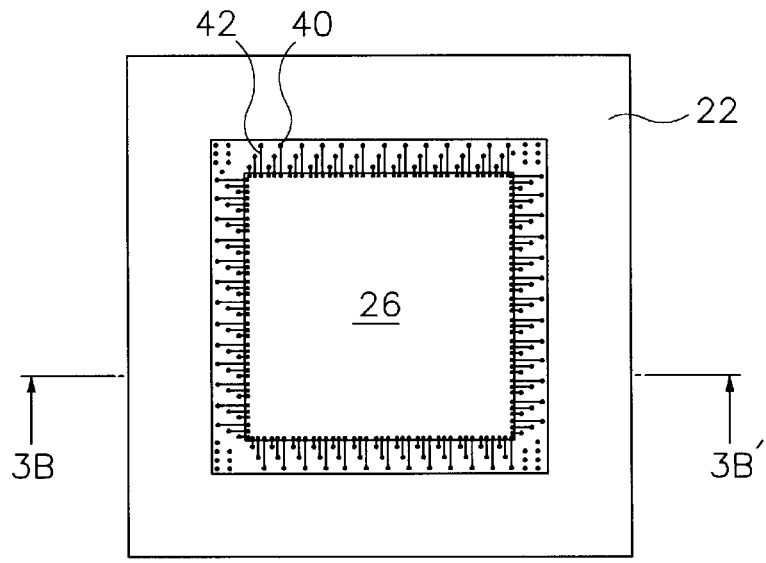
FIGS. 3A to 5B show views of the processes of manufacturing the package of FIG. 2.
Figure 3B:
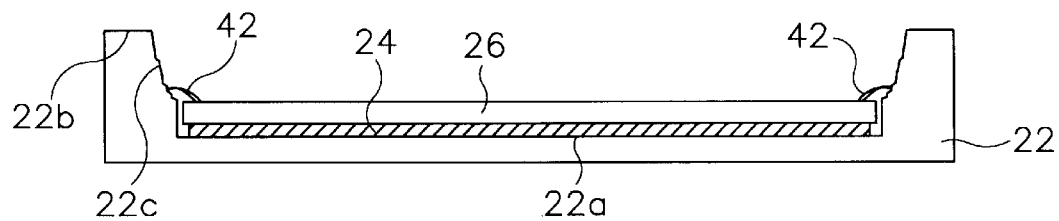

FIG. 3A is a plan view of showing a state in which the first semiconductor chip 26 is mounted on the first surface of the substrate 22, and FIG. 3B is a cross-sectional view taken by line 3B-3B'.

Figure 3C:
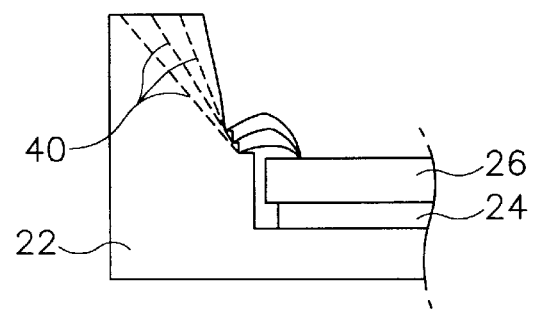

Referring to FIGS. 3A and 3B, for example, there is provided the substrate 22 which has the shape of a hexahedron and of which the first surface 22a and second surface 22b have different heights from each other. The height of the first surface 22a at the center of the substrate 22 is lower than that of the second surface 22b at the edge of the substrate 22. The substrate 22 is made of an insulator, preferably a plastic compound. An inner wall surface 22c of the substrate 22 has an incline angle. And in the inner wall surface 22a, there are buried a plurality of second conductive leads (or studs) 40 for inputting and outputting signals to and from the first semiconductor chip 26, as shown in FIG. 3C. Preferably, the second leads 40 are made of Au. As shown in FIG. 3C, in the inner wall surface 22c, each lead is arranged in a same perpendicular plane. This progresses the integrity of the leads 40. On the first surface 22a of the substrate 22, the first semiconductor chip 26 having a plurality of pad electrodes along the edge of the first semiconductor chip 26 is attached by an adhesive 24. After attaching the first semiconductor chip 26, a process of electrically connecting the second leads 40 with the pad electrodes of the first semiconductor chip 26 is carried out. In this embodiment, since the first semiconductor chip 26 and second leads 40 are apart from each other with a distance, each of the second leads 40 is connected through wires 42 to the correspondent pad electrodes. However, this wire bonding can be changed to another method.

Figure 4A:
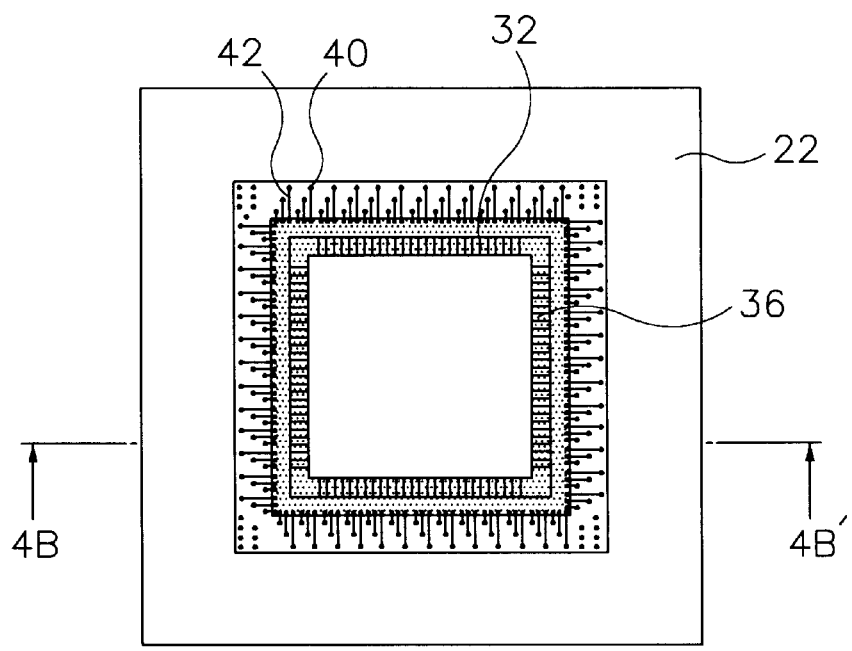
Figure 4B:
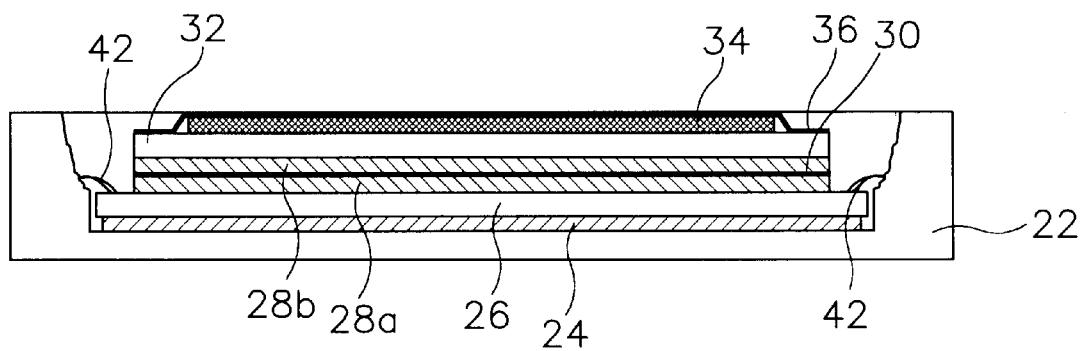

Referring to FIGS. 4A and 4B, in order to stack the second semiconductor chip 32 of which surface area is smaller than that of the first semiconductor chip 26, the first tape 28a is attached on the first semiconductor chip 26, and then the carrier film 30 and second tape 28b are attached thereon in order. The second semiconductor chip 32 is placed on the second tape 28b, and on the second semiconductor chip 32, there is located the elastomer 34 which has a size capable of exposing the pad electrodes formed along the edge of the second semiconductor chip 32. The beam lead film 36, in which a wiring is patterned, is attached on the elastomer 34 and the edge of the second semiconductor chip 32. And then, Beam lead bonding is carried out so that the plurality of pad electrodes formed on the edge of the second semiconductor chip 32 is electrically connected with the first leads of the beam lead film 36. In FIG. 4A, there is a plan view of showing the state in which the above processes are completed.

After finishing the wiring process, the incline area, in which the wires are exposed, is sealed by a sealant 44. At this time, the sealant 44 is a liquid resin.

Figure 5A:
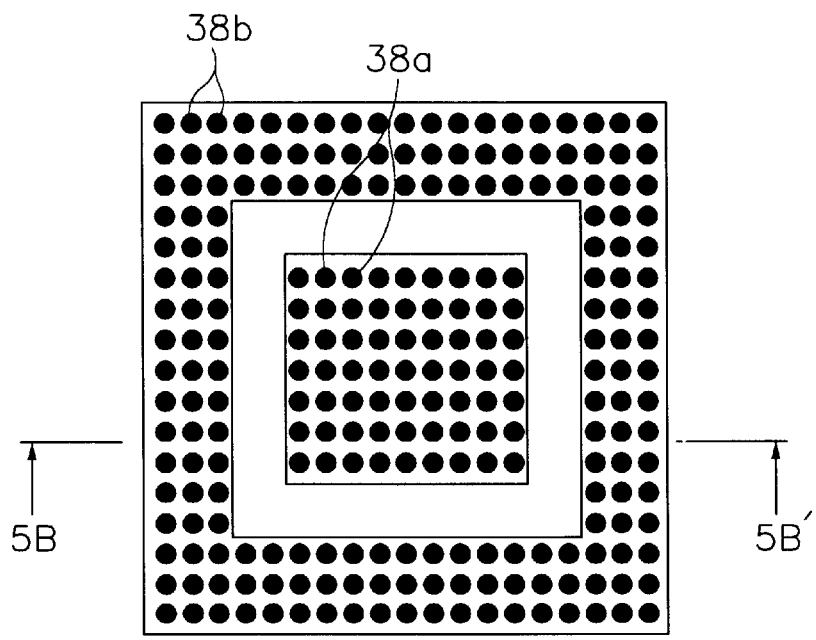
Figure 5B:
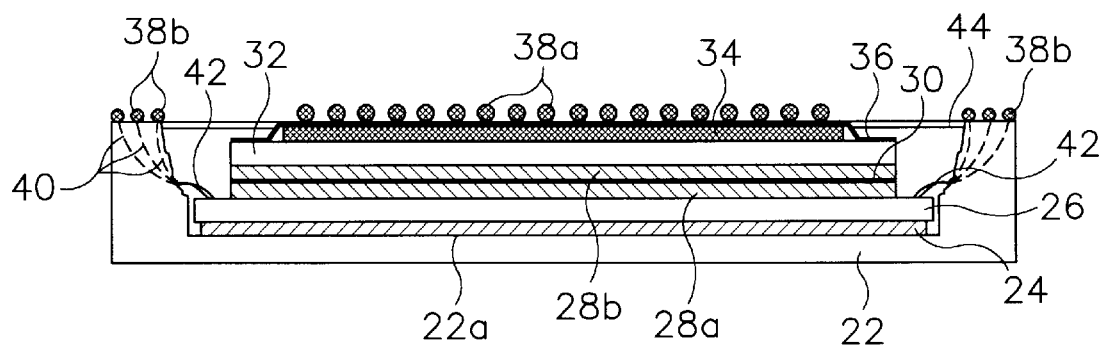

Then, as shown in FIG. 5A and FIG. 5B, for inputting and outputting signals to and from the respective first semiconductor chip 26 and second semiconductor chip 32, a process for forming the solder balls is carried out. The ends of second leads 40 exposed to the second surface 22b of the substrate 22 are respectively contacted with the second solder balls 38b formed on the second surface 22b. Each of the first leads of the beam lead film 36 is contacted with the first solder balls 38a formed on the beam lead film 36, thereby forming a system for transferring electric signals.

In the above embodiments, although examples, in which the two semiconductor chips are stacked, are disclosed, it is also possible to stack 3 or more semiconductor chips. That is, the semiconductor chip which is place on the most upper portion is wired by a same way as in the second semiconductor chip 32 in the above embodiment. And remaining semiconductor chips are connected through wires. As a result, it is possible to manufacturing a package having a higher capability.

In the meantime, the above mentioned method of manufacturing the BGA package can be also applied to a single semiconductor chip package in which a short between the solder balls may be occurred due to a great number of the bonding pads. In this case, a part of the bonding pads in the semiconductor chip forms a passage for transferring electric signals with the second solder balls formed on the second surface of the substrate. The rest bonding pads of the semiconductor chip forms a passage for transferring electric signals with the first solder balls formed on the upper portion of the beam lead film.

As mentioned above, the BGA package of the present invention stacks a number of semiconductor chips, whereby a package having the higher capacity in a same surface area can be realized. In addition, since in the BGA package, it is possible to form solder balls for inputting and outputting the signals to and from the bonding pads of the semiconductor chip in the upper portions of the substrate as well as the chip, the short between the solder balls can be prevented. Furthermore, since in the BGA package, it is not necessary to apply a higher wire bonding method, the cost for manufacturing the package can be reduced as well as the reduction in the yield can be prevented. Moreover, since the completed package is a down type, the heat discharging effect is excellent.

Although the preferred embodiment of this invention has been disclosed for illustrative purpose, those skilled in the art will appreciate that various modifications, additions and substitutions are possible, without from the scope and spirit of the invention as described in the accompanying claims.

What is claimed is:

1. A ball grid array package comprising:
   a substrate having a first surface and a second surface, which is positioned in a higher place than the first surface and which is formed around the first surface;
   a plurality of semiconductor chips, each of which has a plurality of pads thereon for transferring signals, said plurality of semiconductor chips having a first semiconductor chip, which is positioned on the first surface of the substrate, and a second semiconductor chip, which is located above the first semiconductor chip;
   a plurality of leads mounted on the substrate and having first ends, which are electrically connected to at least some of the pads of the first semiconductor chip, and second ends, which are exposed to the second surface of the substrate;
   a plurality of first conductive solder balls formed above a surface of the second semiconductor chip and electrically connected to at least some of the pads of the second semiconductor chip; and
   a plurality of second conductive solder balls formed on the second surface of the substrate and electrically connected to the second ends of the leads.

2. The ball grid array package of claim 1, further comprising a compliant layer interposed between the second semiconductor chip and the first solder balls, said compliant layer including a conductive patterned layer, which connects the pads of the second semiconductor chip to each other, and a buffered layer, which reduces an external impact to the second semiconductor chip.

3. The ball grid array package of claim 2, wherein said buffered layer is an elastomer.

4. The ball grid array package of claim 1, wherein the pads of the first semiconductor chip are connected to the leads through a plurality of wires.

5. The ball grid array package of claim 4, wherein the wires are sealed with a cured liquid resin.

6. The ball grid array package of claim 1, wherein the first semiconductor chip is adhered to the first surface of the substrate by an adhesive.

7. The ball grid array package of claim 1, further comprising a first tape, a carrier film and a second tape stacked in order between the first and second semiconductor chips.

8. A ball grid array package comprising:
   a substrate having a first surface and a second surfaces which is positioned in a higher place than the first surface and which is formed around the first surface;
   a first semiconductor chip which is arranged on the first surface and which has a plurality of pads placed on an upper edge of the first semiconductor chip for transferring signals;
   a second semiconductor chip which is arranged on an upper face of the first semiconductor chip, which has a smaller size than the first semiconductor chip so as to expose the pads of the first semiconductor chip and which includes a plurality of pads thereon;
   a plurality of leads mounted on the substrate, electrically connected with the pads of the first semiconductor chip and exposed to the second surface; and
   a plurality of conductive solder balls which are formed on a surface of the second semiconductor chip and the second surface of the substrate and which are electrically connected with the leads exposed to the second surface of the substrate and with the pads of the second semiconductor chip.

9. The ball grid array package of claim 8, further comprising a compliant layer which is interposed between the second semiconductor chip and the solder balls, said compliant layer including a conductive patterned layer, which connects said pads of the second semiconductor chip to each other, and a buffered layer, which reduces an external impact to the second semiconductor chip.

10. The ball grid array package of claim 8, wherein said buffered layer is an elastomer.

11. The ball grid array package of claim 8, wherein the pads of the first semiconductor chip are connected to the leads through a plurality of wires.

12. The ball grid array package of claim 11, wherein the wires are sealed with a cured liquid resin.

13. The ball grid array package of claim 8, wherein said first semiconductor chip is adhered to the first surface of the substrate by an adhesive.

14. The ball grid array package of claim 8, further comprising a first tape, a carrier film and a second tape stacked in order between the first and second semiconductor chips.

15. The ball grid array package of claim 8, wherein some of the solder balls are positioned on the surface of the second semiconductor chip; and wherein some of the solder balls are positioned on the second surface of the substrate.

* * * * *

UNITED STATES PATENT AND TRADEMARK OFFICE
CERTIFICATE OF CORRECTION

PATENT NO. : 6,072,700
DATED : June 6, 2000
INVENTOR(S) : Teck Hown Nam

It is certified that error appears in the above-identified patent and that said Letters Patent is hereby corrected as shown below:

Title page,
Item [54], Title, before "BALL", insert -- "STACKED" --.

Column 1,
Line 45, delete "INVEHTION" and insert -- INVENTION" --;

Column 3,
Line 42, delete "26a" and insert -- 32a" --;
Line 61, delete "30";
Line 66, delete "35"; and Column 6,
Line 46, delete "surfaces" and insert -- surface," --.

Signed and Sealed this

Twenty-eighth Day of October, 2003

JAMES E. ROGAN
*Director of the United States Patent and Trademark Office*